United States Patent
How et al.

(10) Patent No.: US 10,523,207 B2
(45) Date of Patent: Dec. 31, 2019

(54) PROGRAMMABLE CIRCUIT HAVING MULTIPLE SECTORS

(71) Applicant: Altera Corporation, San Jose, CA (US)

(72) Inventors: Dana How, Palo Alto, CA (US); Sean R. Atsatt, San Jose, CA (US); Michael David Hutton, Mountain View, CA (US); Herman Henry Schmit, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 141 days.

(21) Appl. No.: 14/460,548

(22) Filed: Aug. 15, 2014

(65) Prior Publication Data

US 2016/0049941 A1    Feb. 18, 2016

(51) Int. Cl.
*H03K 19/177*    (2006.01)
*H03K 19/007*    (2006.01)

(52) U.S. Cl.
CPC ..... *H03K 19/17728* (2013.01); *H03K 19/007* (2013.01); *H03K 19/1776* (2013.01);
(Continued)

(58) Field of Classification Search
CPC .......... H03K 19/007; H03K 19/17728; H03K 19/17736; H03K 19/17748;
(Continued)

(56) References Cited

U.S. PATENT DOCUMENTS

| | | | |
|---|---|---|---|
| 5,426,378 A * | 6/1995 | Ong | H03K 19/1737 |
| | | | 326/38 |
| 6,100,714 A * | 8/2000 | Xiao | H03K 19/17704 |
| | | | 326/39 |

(Continued)

FOREIGN PATENT DOCUMENTS

| | | |
|---|---|---|
| CN | 102692991 A | 9/2012 |
| CN | 103366034 A | 10/2013 |

(Continued)

OTHER PUBLICATIONS

Partial European Search Report dated Dec. 23, 2015 for EP 1 18 08 73.

(Continued)

*Primary Examiner* — Seokjin Kim
(74) *Attorney, Agent, or Firm* — Fletcher Yoder, P.C.

(57) ABSTRACT

Systems and methods relating to a programmable circuit. The programmable circuit includes multiple sectors. Each sector includes configurable functional blocks, configurable routing wires, configuration bits for storing configurations for the functional blocks and routing wires, and local control circuitry for interfacing with the configuration bits to configure the sector. The programmable circuit may include global control circuitry for interfacing with the local control circuitry to configure the sector. Each sector may be independently operable and/or operable in parallel with other sectors. Operating the programmable circuit may include using the local control circuitry to interface with the configurations bit and configure the sector. Additionally, operating the programmable circuit may include using the global control circuitry to interface with respective local control circuitry and configure the sector.

18 Claims, 10 Drawing Sheets

(52) U.S. Cl.
CPC . *H03K 19/17736* (2013.01); *H03K 19/17748* (2013.01); *H03K 19/17764* (2013.01)

(58) Field of Classification Search
CPC ......... H03K 19/1776; H03K 19/17764; H03K 19/17704; H03K 19/1733; H03K 19/1737; G06F 17/5054
USPC ....... 326/9–15, 37–50, 101–103; 716/16, 17, 716/113, 117
See application file for complete search history.

(56) References Cited

U.S. PATENT DOCUMENTS

| | | | | |
|---|---|---|---|---|
| 6,150,841 | A * | 11/2000 | Agrawal | H03K 19/17728 326/39 |
| 6,924,663 | B2 * | 8/2005 | Masui | G06F 21/76 326/38 |
| 7,236,000 | B1 * | 6/2007 | Steiner | H03K 19/0033 326/10 |
| 7,408,381 | B1 * | 8/2008 | Drimer | G06F 17/5054 326/38 |
| 7,772,872 | B2 * | 8/2010 | Lewis | H03K 19/00392 326/10 |
| 7,852,107 | B1 * | 12/2010 | Sundararajan | H03K 19/00338 326/10 |
| 7,973,556 | B1 * | 7/2011 | Noguera Serra | H03K 19/177 326/38 |
| 8,493,089 | B2 * | 7/2013 | Cordero | H03K 19/17796 326/101 |
| 8,497,703 | B2 * | 7/2013 | Kim | H03K 19/17752 326/39 |
| 8,704,548 | B1 * | 4/2014 | Hutton | H03K 19/17736 326/38 |
| 8,760,193 | B2 * | 6/2014 | Voogel | H03K 19/17744 326/38 |
| 8,996,906 | B1 * | 3/2015 | Townley | G06F 1/06 713/600 |
| 9,178,518 | B2 * | 11/2015 | Calhoun | H03K 19/17744 |
| 2004/0222817 | A1 | 11/2004 | Madurawe | |
| 2006/0273823 | A1 * | 12/2006 | Kamp | H03K 19/17748 326/41 |
| 2012/0256653 | A1 | 10/2012 | Cordero et al. | |
| 2013/0093460 | A1 | 4/2013 | Voogel et al. | |
| 2014/0126572 | A1 * | 5/2014 | Hutton | H04L 49/109 370/360 |
| 2014/0132305 | A1 * | 5/2014 | Gaide | G06F 1/10 326/93 |
| 2014/0140397 | A1 * | 5/2014 | Kim | G11C 11/41 375/240.12 |
| 2015/0145559 | A1 * | 5/2015 | Kozuma | H03K 19/1776 326/38 |
| 2017/0024349 | A1 * | 1/2017 | Yang | H03K 19/1774 |

FOREIGN PATENT DOCUMENTS

| | | |
|---|---|---|
| CN | 103390425 A | 11/2013 |
| CN | 103677077 A | 3/2014 |
| CN | 103971732 A | 8/2014 |
| EP | 2662861 A2 | 11/2013 |
| EP | 2 722 989 | 4/2014 |
| WO | 2007149472 A2 | 12/2007 |
| WO | WO2011/156038 | 12/2011 |

OTHER PUBLICATIONS

Extended EP Search Report for EP Application No. 15180873.0 dated May 2, 2016.
Chinese Office Action for CN Application No. 201510501680 dated Mar. 27, 2018; 7 Pages.
Chinese Notice of Allowance for CN Application No. 201510501680 dated Nov. 29, 2018; 4 Pages.

* cited by examiner

PROGRAMMABLE CIRCUIT HAVING MULTIPLE SECTORS

FIELD

This disclosure relates to the internal organization for a programmable circuit, such as a field-programmable gate array (FPGA).

BACKGROUND

A programmable circuit, such as a field-programmable gate array (FPGA), may realize a design using components whose behavior and interconnections are configurable after manufacture. However, such a circuit may require numerous and possibly hidden support functions for configuration, test, clocking, and power. Additionally, as FPGA component counts have grown, the area cost of these functions has remained or grown, their bandwidth has fallen behind, and their complexity and rigidity have delayed schedules and reduced customer features.

SUMMARY

This disclosure relates to a new internal organization for a programmable circuit, such as an FPGA, where the circuit is divided into "sectors," each containing local resources for configuration, test, clocking, and power. A sector is a region of a programmable circuit, such as an FPGA, containing local resources for one or more of configuration, test, clocking, and power. The programmable circuit may have multiple such sectors. The sectors may be identical or vary in size and resources. Each sector may include local resources, such as processors, state machines, and/or buses, which facilitate communications and operations during wafer test, package test, initialization, configuration, or other non-user functions. The local resources may be interconnected using additional global wiring controlled by a separate global controller. The sector boundaries may anchor new clocking, power, data transmission, and other suitable features. As such, sectors may operate on a shared clock or operate on their own independent clocks. Prior implementations have implemented support functions in a monolithic manner at the full-chip level. However, the decomposition of the support functions into smaller components simplifies their design and the new interconnections increase their bandwidth and flexibility. These attributes may help deliver higher integration levels with reduced implementation complexity.

Accordingly, systems and methods relating to a programmable circuit having sectors are described. In some aspects, the programmable circuit includes multiple sectors. Each sector includes configurable functional blocks, configurable routing wires, configuration bits for storing configurations for the functional blocks and routing wires, and local control circuitry (or local controller) for interfacing with the configuration bits to configure the sector. In certain embodiments, the programmable circuit includes global control circuitry (or global controller) for interfacing with the local control circuitry to configure the sector. In certain embodiments, each sector is independently operable and/or operable in parallel with other sectors.

In some aspects, a method for operating the programmable circuit is described. The method for operating the programmable circuit includes using the local control circuitry to interface with the configuration bits and configure the sector. Additionally, the method for operating the programmable circuit includes using the global control circuitry to interface with respective local control circuitry and configure the sector. The process may be performed by a processor of a programmable logic device, for example, and may be encoded as instructions, on a transient or non-transient machine readable medium, that are executed by a processor.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION

Figure 1:
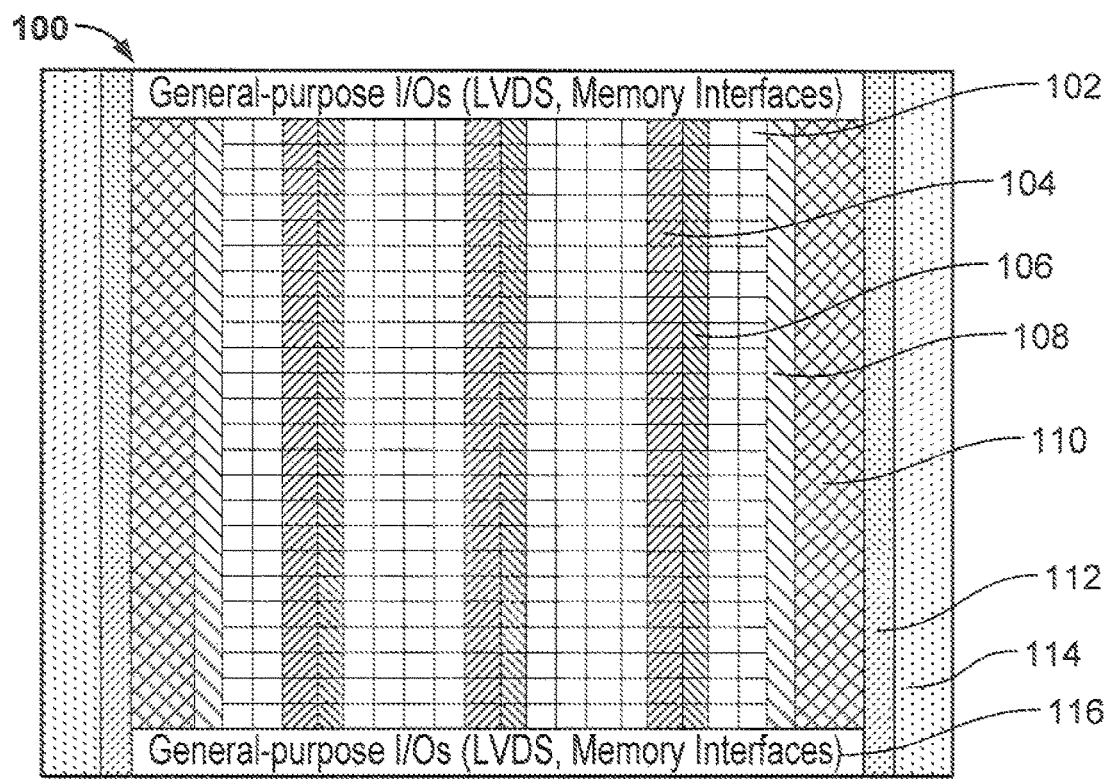
FIG. 1 depicts an illustrative floorplan for a programmable circuit according to certain embodiments.

FIG. 1 depicts an illustrative floorplan 100 for a programmable circuit, such as an FPGA. Typical functional blocks in an FPGA may include one or more of logic 102 (e.g., Look-Up Tables, D-Flip-Flops, or other suitable components), memory and digital signal processing (DSP) blocks 104, internal memory blocks 106, phase locked loop (PLL) blocks 108, high-speed serial transceivers interconnect blocks 110-114, general purpose I/Os 116 (e.g., DDR memory interfaces or other suitable components), clocking, and other suitable resources. The programmable interconnect fabric for the programmable circuit may include a network of routing wires and programmable switches which are configured by SRAM bits or other suitable means to implement routing connections between the blocks. The programmable circuit may utilize "point-to-point" routing, where a path between a source signal generator and its destinations is fixed at compile time. In certain embodiments related to partial reconfiguration, the programmable circuit may utilize other suitable means of routing to implement block-level replacements.

Figure 2:
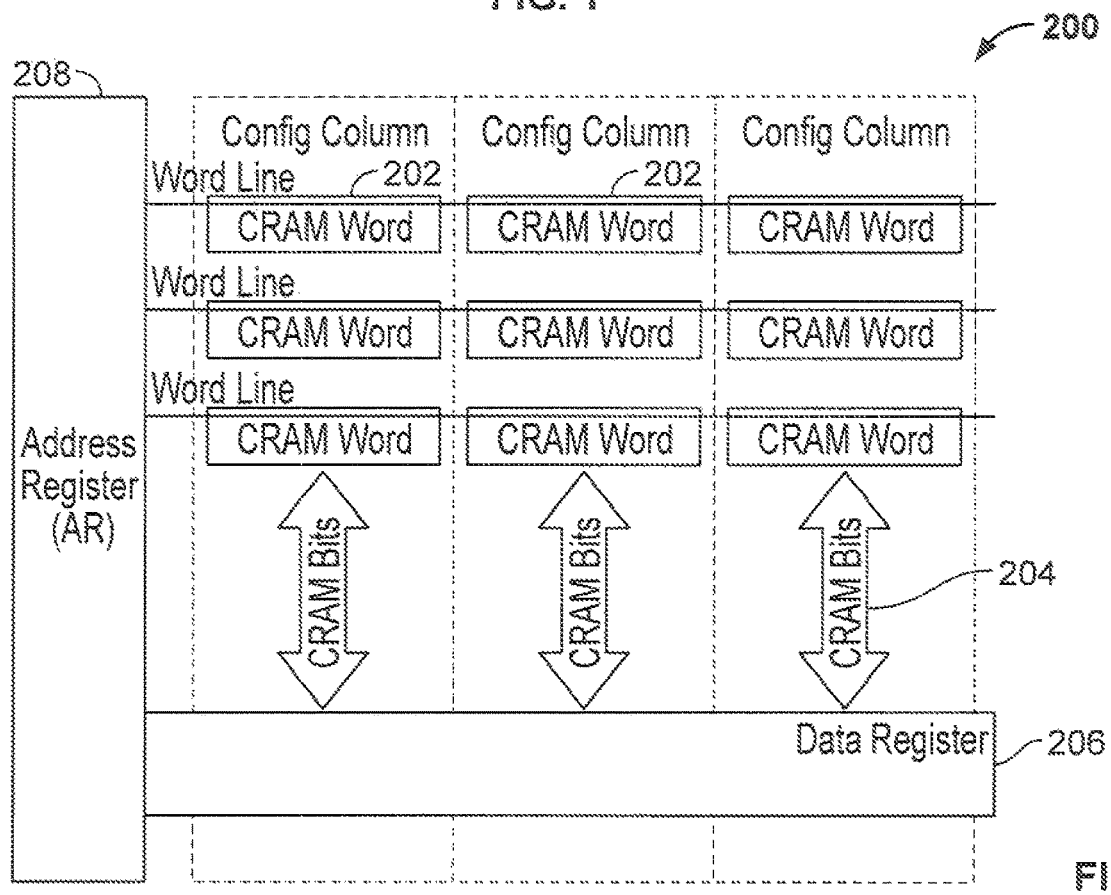
FIG. 2 depicts an illustrative diagram of a Configuration RAM (CRAM) array according to certain embodiments.

In order to specify its function, each functional block may be associated with "Configuration RAM" bits, which together form a Configuration RAM array 202, as depicted in FIG. 2. These bits may supply constant values 204 to the logic which configures its functions. FIG. 2 also shows an additional piece of logic, the Configuration Machine including Data Register 206 and Address Register 208, which may be used on power-up to accept a bitstream through a separate, dedicated port and then write it to the Configuration RAM bits.

Figure 3:
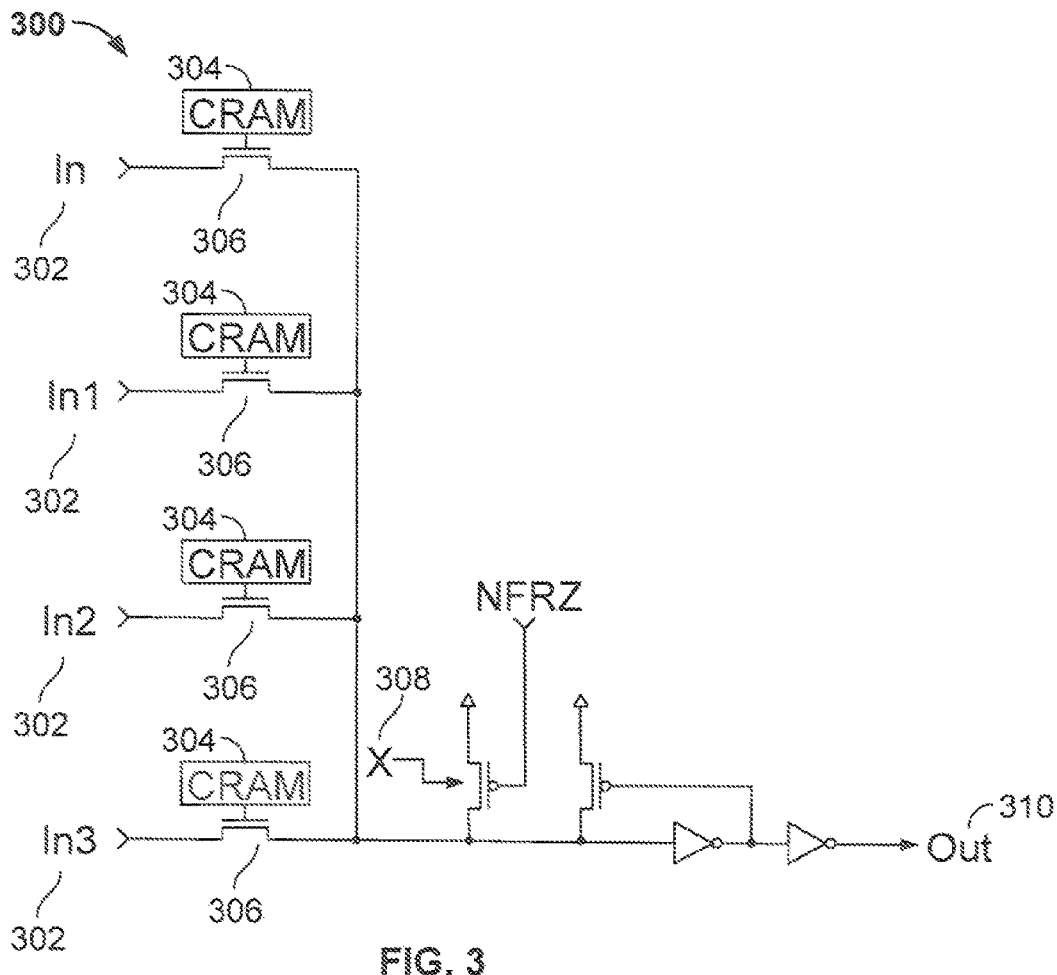
FIG. 3 depicts an illustrative diagram of "hold-off" signals included for CRAM bits in a multiplexer according to certain embodiments.

In certain embodiments, the functionality of the logic whose associated CRAM bits are being written may be dynamically changing as the bitstream is written to the CRAM array. Depending on the circuit-level implementations of the multiplexers and other logic, this dynamism may result in intermittent short circuits and other undesirable effects. Consequently, the configuration machine may generate various "hold-off" signals to force the configured logic to be quiescent until after all the CRAM bits have been written. FIG. 3 depicts an illustrative embodiment of such "hold-off" signals included in multiplexer 300 having inputs 302 and output 310. This embodiment includes a "one-hot" implementation, where each switch 306 is directly and independently controlled by an independent CRAM bit 304. The word line and bit line drivers may include additional circuitry and control signals so they can all be forced to HIGH and LOW, respectively. This may force all CRAM bits to be zero and thus all branches in the multiplexer may be turned off, avoiding short circuits. In this condition, however, the point of convergence in multiplexer 300 may not be driven, and thus transistor 308 may be added to drive this node HIGH. The local controllers may generate the signals internally that force the word and bit lines to HIGH as well as drive multiplexer 300 to HIGH.

Figure 4:
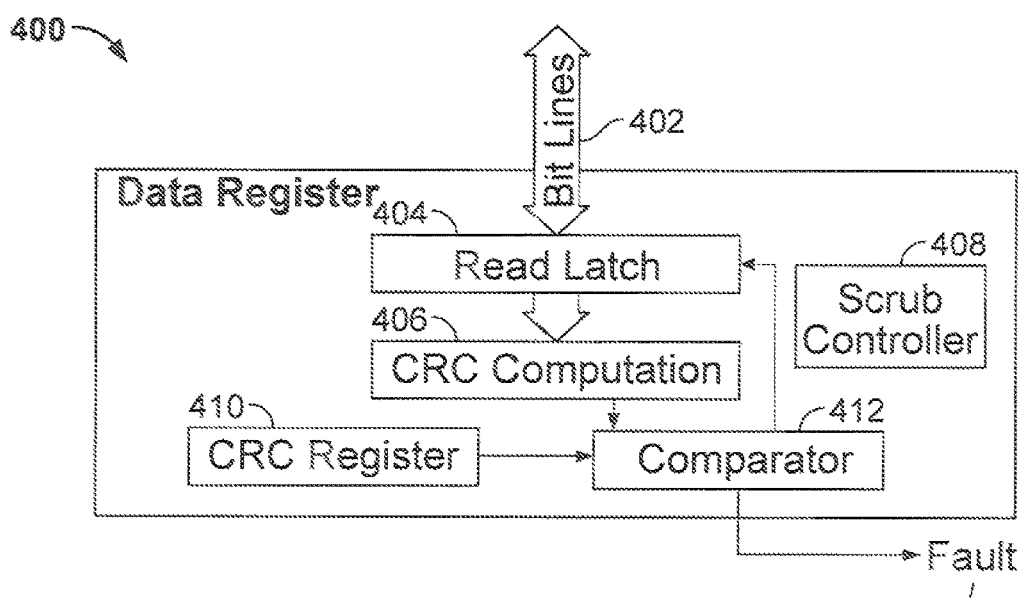
FIG. 4 depicts an illustrative diagram of hardware for detecting and correcting single-event upsets (SEUs) according to certain embodiments.

In certain embodiments, a programmable circuit such as an FPGA may be susceptible to Single-Event Upsets (SEUs) during normal operation, just like other digital logic. In other logic, these SEUs may unpredictably alter a design's state, but with a programmable circuit, since the structure of the design itself is stored in memory bits, an SEU may also unpredictably alter the design and hence its function. For this reason, SEU mitigation is an important consideration for programmable circuits, such as FPGAs. To address this issue, background hardware may be enhanced to continually re-read the FPGA's configuration, use CRC and/or ECC techniques to detect and correct SEUs in these bits, and then write back the updates as needed. FIG. 4 depicts an illustrative embodiment of such background hardware. Particularly, data register 400 may include scrub controller 408 and read latch 404 which receives bit lines 402. Scrubbing includes inspecting the sector for errors in stored data and correcting the errors using a previously stored copy of the data or other redundant information. CRC Computation block 406, CRC Register 410, and Comparator block 412 may work in conjunction and use CRC and/or ECC techniques to detect fault 414 and correct SEUs in these bits. These techniques may be directed by scrub controller 408 and write back updates to correct bits as needed.

Figure 5:
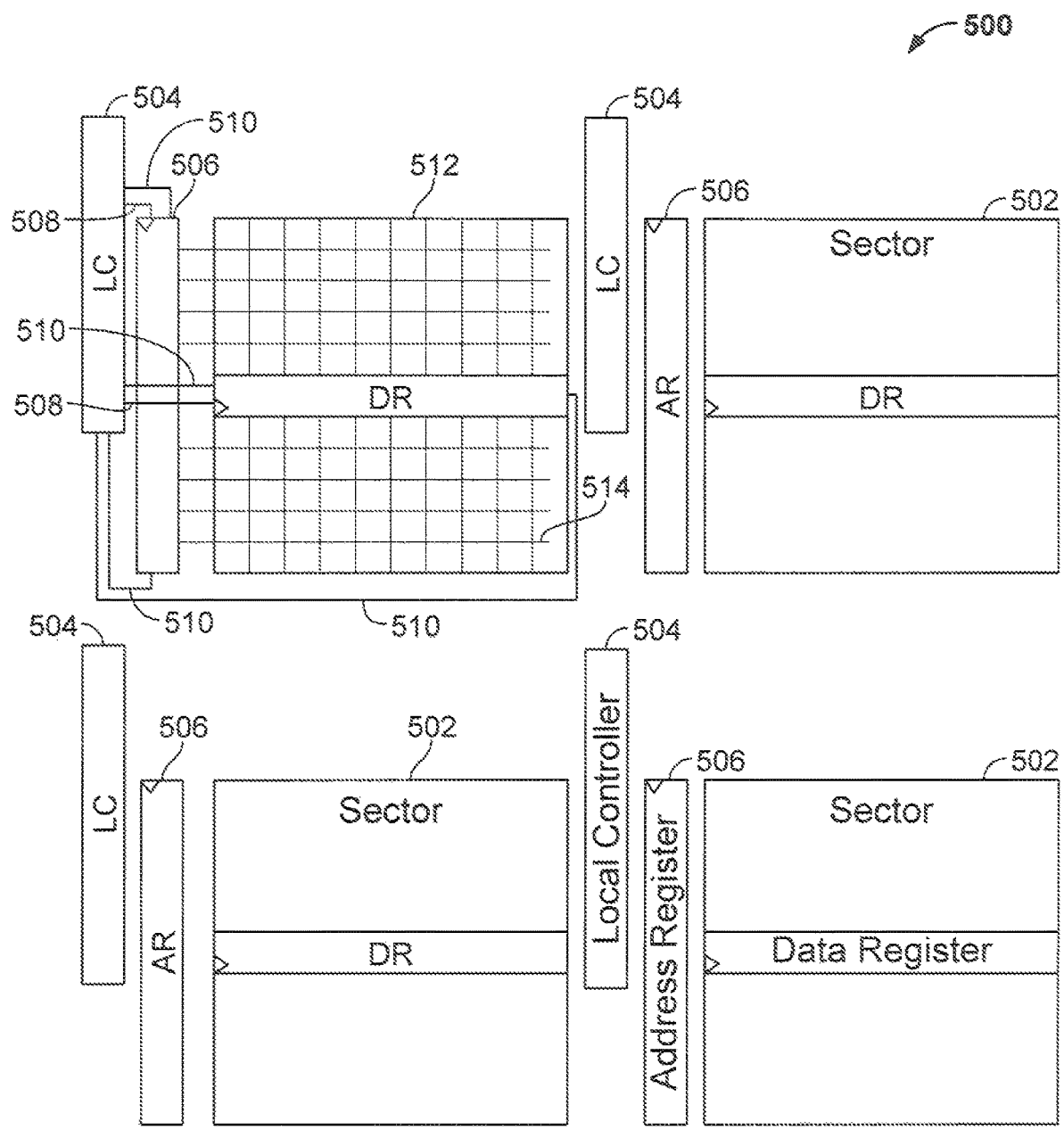
FIG. 5 depicts an illustrative diagram of a programmable circuit divided into sectors according to certain embodiments.

In certain embodiments, a programmable circuit may include sectorized configuration memory. FIG. 5 depicts an illustrative embodiment of configuration memory 500 of an FPGA divided into four sectors 502. Each sector may include the configuration RAM bits which specify the function and/or interconnections of the subcomponents and wires in or crossing that sector. Each sector may include bit lines 512 and word lines 514 at right angles to each other. These may be used to modify and read back the configuration RAM contents. Word line drivers for the word lines and bit line drivers and sense amplifiers for the bit lines may be included along the edge of the sector. These may be accessed through adjacent shift registers 506, which reduce the possibly vast numbers of word and bit lines down to just a few clock lines 508 and data lines 510. The registers may be fully loaded and unloaded (read back) using just these few clock lines 508 and data lines 510. To control shift registers 506, each sector may include local controller 504. These controllers may manipulate and observe clock lines 508 and data lines 510. Furthermore, local controllers 504 may be connected via a simple communication network to a global controller. The global controller may connect to device pins through which it can communicate with the outside world. The global controller may sit between these pins and the local controllers, sending commands to the local controllers as required and conveying data between the controllers and the device pins.

In a non-sectorized FPGA, only the upper left "sector" would appear, and the global controller and the single local controller would be combined into one single control block. Its word lines and bit lines would run across the entire chip. A first advantage of the sectorized FPGA may be that the word lines and bit lines are much shorter, and thus quicker in operation and needing less power per bit accessed. Additionally, the sectorized local controllers may advantageously operate independently and in parallel. The global controller may accept commands and data at a much higher rate, since it is responsible for far less global communication; this may be sent to the local controllers in a round-robin way, for example, with each of them operating at a lower rate but in parallel. This parallelism may also contribute to the greater operation speed and bandwidth of the sectorized FPGA during configuration. Additionally, the inclusion of a local controller in each sector may allow all previously independent wires to be replaced by a set of global wires. The activity that would have been on the previously independent wires is now transactionalized and the local controller can decode these transactions and perform the appropriate local operation. Thus, the local controller may act as a decoder which can be used to vastly decrease the global wire count.

In addition to the word lines and bit lines that interface with the configuration bits, the local controllers may also control "hidden" mode-control and "hold-off" signals that, among other things, are responsible for bringing the logic in a sector smoothly out of configuration and into normal operation. The independence of the local controllers and of the sectors they control may offer other advantages. After power-on, it may take quite some time to get all the configuration data into an FPGA, and this may delay the full intended functionality of the device. In some applications, some of the functionality is required to be present more quickly than the full functionality of the FPGA can be configured. This mismatch may be remedied by configuring only one sector, or the minimal number of sectors required to supply the initial functionality, and then de-asserting the "hold-off"/freeze signals only where this process is done so the initial functionality may start operation. This "partial initial configuration" ability means at least part of the chip may start functioning more quickly.

Independent sectors may be used to more easily support partial reconfiguration. In certain embodiments, one or more sectors in an already fully configured part are selected for reconfiguration. Because of the independence of the sectors, the sectors being reconfigured may receive and store configuration data, while the other sectors may operate as before. This latter operation may include scrubbing to correct SEUs (i.e., inspecting the sector for errors in stored data and correcting the errors using a previously stored copy of the data or other redundant information), such that the reliable operation of the untouched sectors may be assured while the sectors of interest are reconfigured. This mix could not be supported in an FPGA without independent sectors.

Both partial initial configuration and partial reconfiguration are features that have been offered in FPGAs. However, to date, their implementation has required special modes and extra functionality in the global controller (configuration machine), and the full investment in this design effort to get it to work properly is seldom made. Furthermore, both these features require additional specialized software support whose completion to date has not been highly prioritized due to uneven customer demand in reaction to the uneven hardware support. With a sectorized FPGA, all configuration modes become identical: full configuration, partial initial configuration, and partial reconfiguration all consist of configuring one or more sectors. Consequently, supporting all three approaches becomes easier and requires less unique additional support.

A number of factors may affect the best size or sizes for the sectors. A smaller sector may be assembled more rapidly with the containing array requiring the same time for its own assembly. However, a larger sector may more easily contain the desired ratio of FPGA component types, as determined by customer preferences, but this better match may be more difficult to re-use for different ratios as needed by other devices in one FPGA product family. Additionally, sectors are not the only large blocks in the top-level FPGA design. High-Speed Serial Interface (HSSI) packs, which include packs of high speed serial transceivers, and multiple-conventional-I/O I/O blocks are other large blocks in the top-level FPGA design. It may be advantageous for the chip assembly process if HSSI packs, I/O blocks, and sectors all had the same height, as this "pitch-matching" may make the full chip easier to assemble from them. This arrangement may be advantageously extended to other large blocks that may be included in the full chip, such as optional processors and other suitable large blocks.

Figure 6:
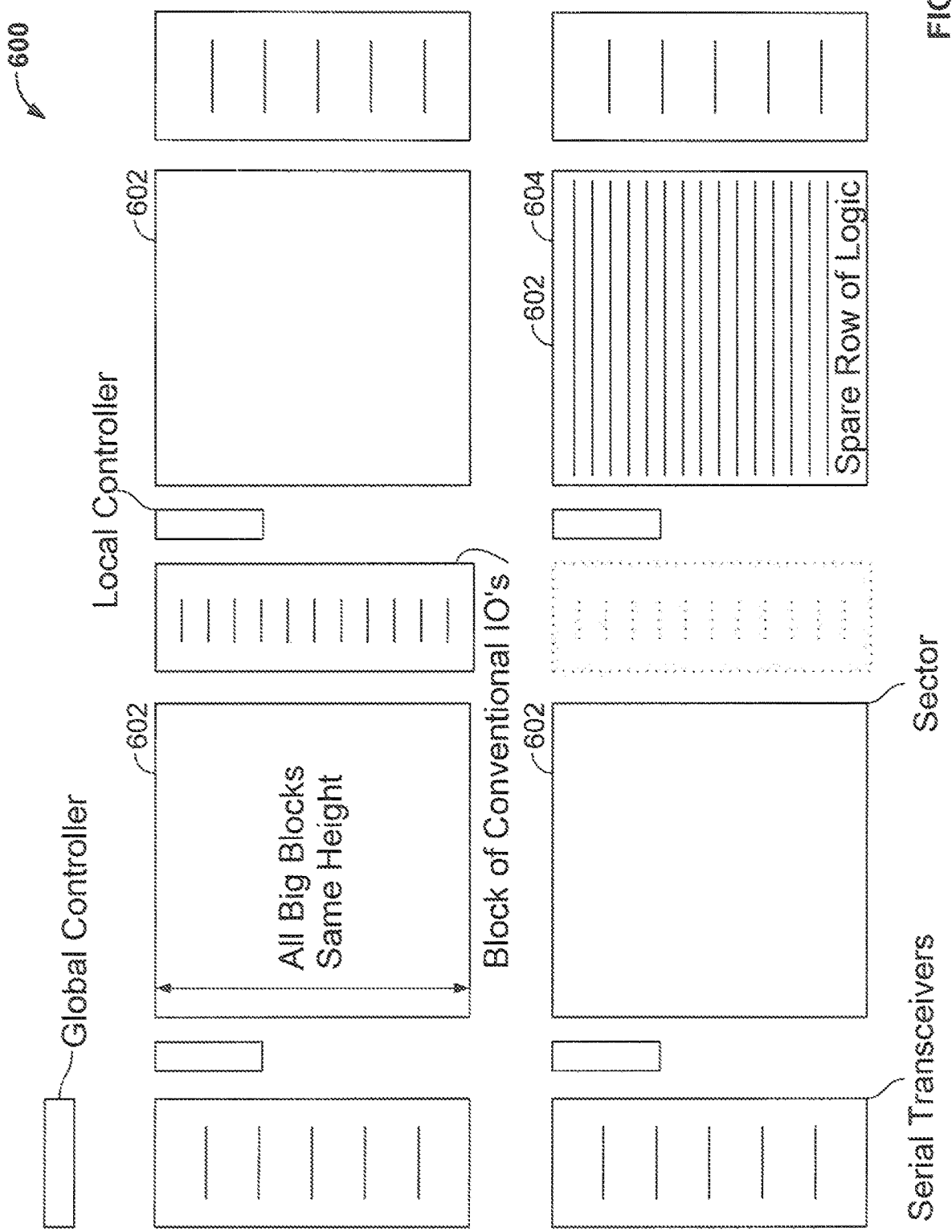
FIG. 6 depicts an illustrative diagram of a sectorized programmable circuit including a redundancy region according to certain embodiments.

It may be recalled from FIG. 1 that FPGAs are conventionally assembled from rows of smaller blocks. Finally, when assembling these rows that contain smaller blocks, it may be advantageous to include "spare rows" in each group of rows so that if there is a defect in one particular row, the portion of the design in that row and the rows below it may be slid down, newly filling the spare row at the bottom of the group. Since sliding rows between sectors may present additional complexities, the height of a sector (the number of such rows in it) may correspond to the height of such a group of rows, called a "redundancy region." Then in a row of sectors, if any subrow (row contained in one sector) were found to contain a defect, all the corresponding subrows across the row of sectors may be moved down inside the row of sectors. This arrangement may support redundancy without adding inter-sector exceptions as illustrated in FIG. 6. As shown, programmable circuit 600 includes sectors 602 and redundancy region 604. The height of sectors 602 corresponds to the height of redundancy region 604.

In certain embodiments, the programmable circuit is structured such that local controllers accept commands and data from the global controller, and write the data into the configuration memory using the appropriate sequencing of controlled signals, such as the word and bit lines. Also, in response to commands from the global controller, the local controllers may orchestrate the reading of the configuration memory and then send the resulting data back to the global controller. In addition to these basic operations, the local controllers may be augmented with numerous additional capabilities. For example, such capabilities may include locally sequencing reads and writes to implement error detection and correction on the configuration RAM array and sequencing test control signals to effect various test modes.

In certain embodiments, the local controllers are implemented as state machines. In certain embodiments, the local controllers are implemented as minimal processors. Each operation they support may be implemented as a separate routine in a memory containing a control program. In certain embodiments, this control program memory may be fixed in, e.g., a read-only memory (ROM). The ROM may be larger than strictly needed, allowing each routine to have multiple variants depending on "modes" the local controller may be placed into. In certain embodiments, the control program memory is implemented as random access memory (RAM). This RAM may be written with new routines in order to implement new operations and functionality into the sectors. This may provide usable extensibility in an efficient and easily understood way. This may be useful because new commands could bring about large amounts of local activity within the sector at the expense of only a small amount of communication between a global controller and local controller. Without this extensibility, new functionality may need to be implemented in terms of pre-existing operations (and most likely many of them). This may increase the needed amount of communication between the global and local processor and prevent fully parallel use of the local controllers.

Since the global controller is responsible for, among other things, coordinating the operations of the local controllers, for ensuring data gets between the outside world and the local controllers, and for security features, the global controller (or at least a portion thereof) may be implemented in a processor as well. This may be a dedicated processor, special boot-up code for a user-visible processor already included in the device's design, or another suitable arrangement.

In certain embodiments, the local controllers provide an opportunity to increase the bandwidth between the programmable circuit and the outside world during configuration and test operations, particularly during wafer test. Before being shipped to customers, programmable circuits, such as FPGAs, are required to be fully tested. Their configurability may be advantageous since multiple designs may be programmed into each part of the programmable circuit until each possible operation has been tested. The cost this imposes, however, is the time required to load the different "test designs" into each part, as well as the test vectors and test responses that may be needed. It may be advantageous to perform the most discriminating tests first to detect a bad part as early as possible, and in particular to detect it before other time-expensive operations are performed on the part. Besides testing, another time-expensive operation is packaging the part. Consequently, accelerating test as much as possible on an unpackaged part may be desirable. One way to test an unpackaged part may be before the wafer has been diced into separate die. Testing at this step is called "wafer test" and involves applying a set of probes to each die location on the wafer. In order to increase the data rate during this step and decrease test time and cost, it may be desirable to support as many probes as possible (and with the highest data rate possible).

Figure 7:
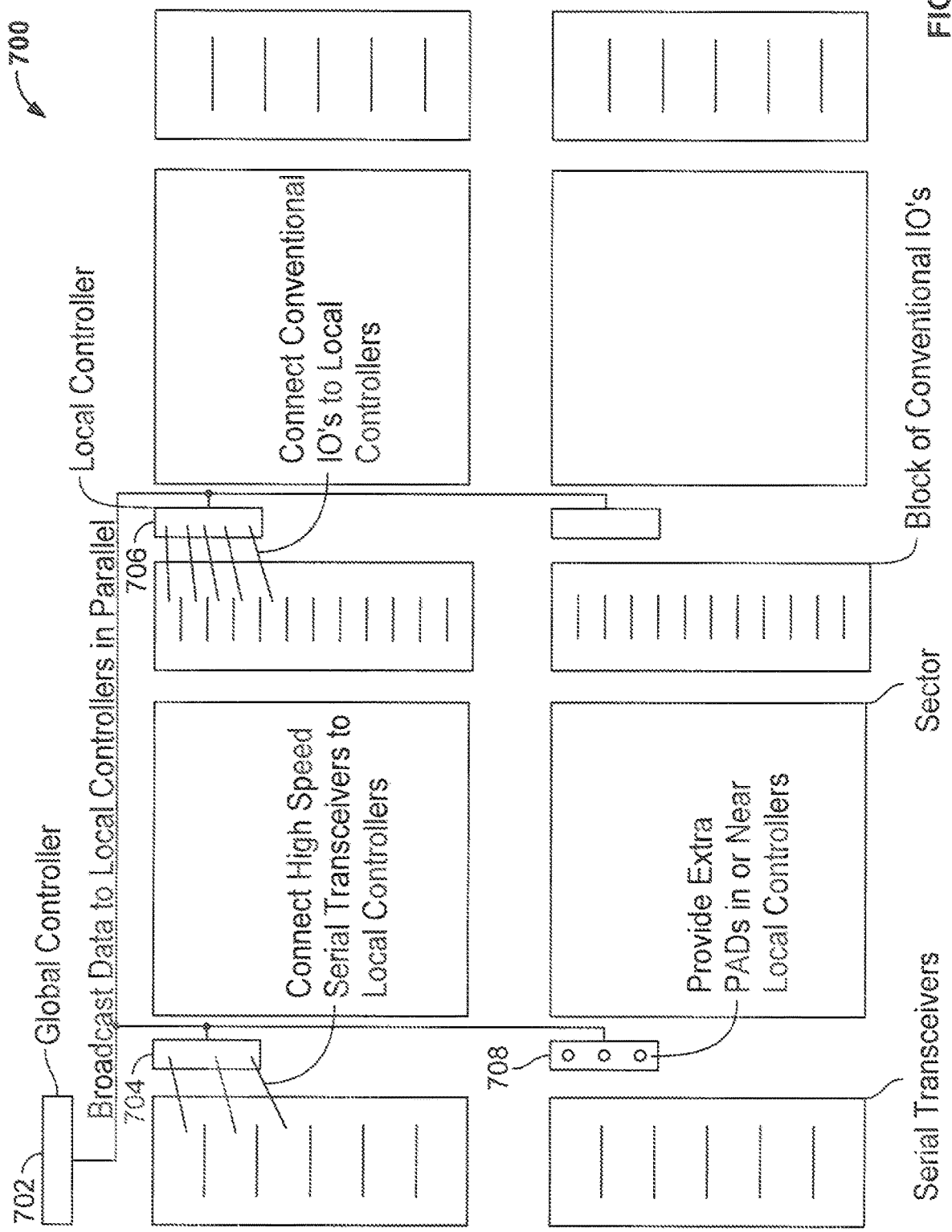
FIG. 7 depicts an illustrative diagram of a sectorized programmable circuit having increased external bandwidth according to certain embodiments.

Such an arrangement as described above and illustrated in FIG. 7 is advantageously implemented in a sectorized programmable circuit 700 since each local controller 704, 706, and 708 may become a natural place to inject data. A non-sectorized programmable circuit or FPGA may require data to flow through the global controller. But in a sectorized programmable circuit or FPGA the array of local controllers can accept data in parallel and pass it along to their sectors. Each local controller may accept its own data in a number of ways. In certain embodiments, the data may be applied through nearby I/O pins, whose bonding pads may be contacted by the probes (e.g., as illustrated with respect to local controller 706). Some of these I/O pins may not be bonded (i.e., left unconnected) depending on the packaging option later selected for the part, such that the connections need only be made during wafer test. Alternatively, probe pads may be added to the local controllers, specifically and only for wafer-test (e.g., as illustrated with respect to local controller 708). The local controllers may also accept configuration data in parallel as broadcast from the global controller. This may allow identical sectors to be simultaneously configured with the same test design. As another alternative, connections may be included between high-speed serialized transceivers (e.g., operating at 28 Gb/s) and the nearest local controllers to transfer data at extremely high data rates, as limited by the test equipment (e.g., as illustrated with respect to local controller 702).

Figure 8:
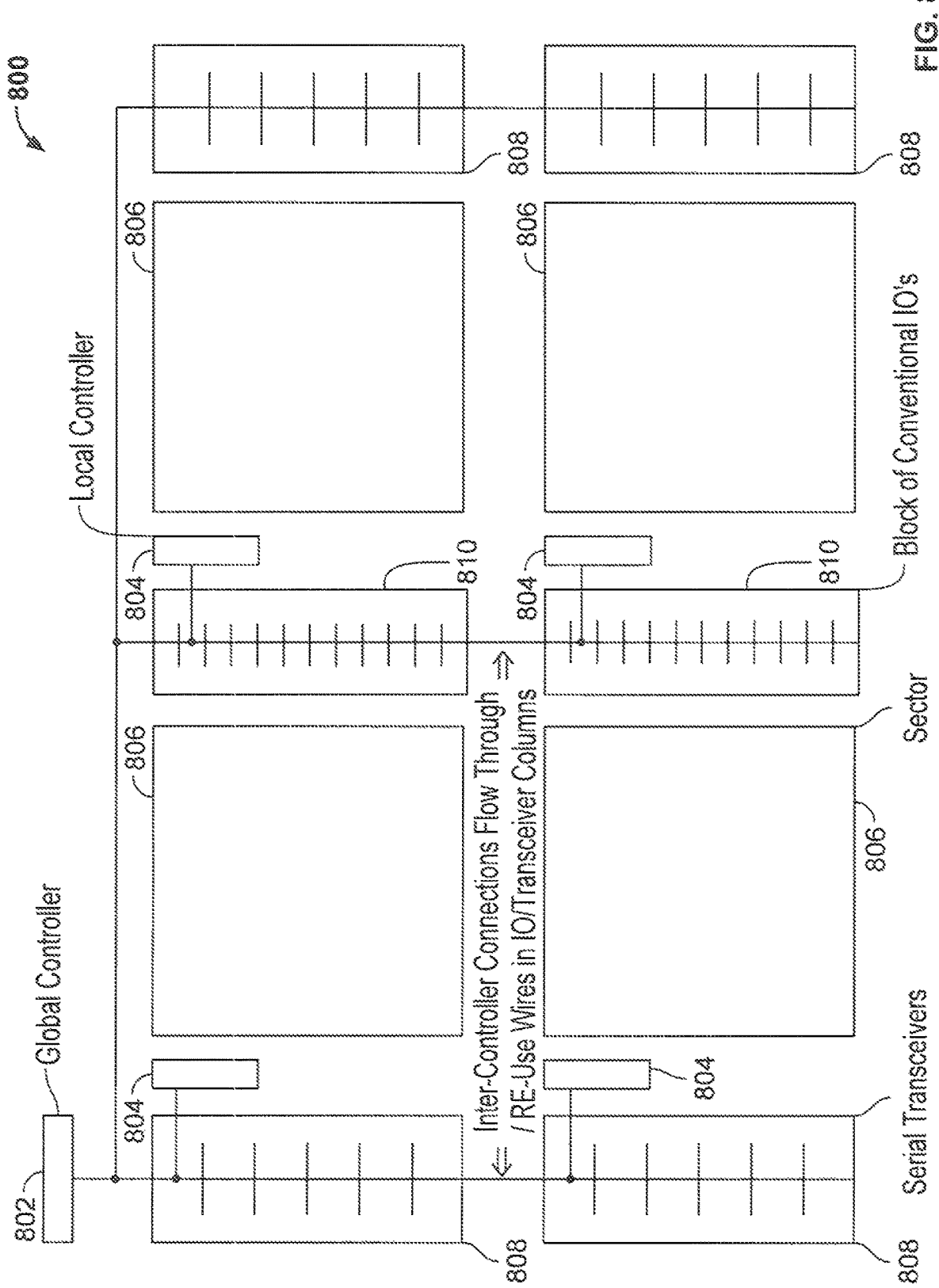
FIG. 8 depicts an illustrative diagram of inter-sector communication in a sectorized programmable circuit according to certain embodiments.

FIG. 8 depicts an illustrative embodiment of programmable circuit 800 showing inter-sector communication between sectors 806. Each local controller 804 communicates with global controller 802. Global controller 802 coordinates their operations and conveys commands initiated from outside the device. In order to support this communication, there may be a network of connections between the global controller and each sector's local controller. This network may be implemented in a number of ways and also be put to other uses besides this basic communication. In certain embodiments, the sectors may be adjoined and surrounded by blocks of other types, such as I/O-oriented blocks. The sectors may have rows or columns of I/O-oriented blocks 808 and 810 distributed throughout as shown in FIG. 8. In certain embodiments, not only the inter-controller communication wires are placed in between sector rows and columns, but some of these wires also appear inside the I/O-oriented columns or rows. This arrangement may save space and provide other advantages as well. In other embodiments, these wires may flow through the sectors themselves, especially at places where the sectors contain objects in common (such as the AR and/or DR) which remain in the same location in all sectors.

Design connections to and from I/O blocks typically need to be longer than connections in general. As such, there may be a greater demand for longer wires near I/O blocks. This demand may be at least partially met by providing extra general wires along the I/O blocks. This implementation may be merged with the inter-sector communication wires that have been partially pushed inside the I/O columns or rows. During configuration, or other non-design operations, the wires may be used to convey information between the controllers (global and/or local). During design operations, these wires may be used to connect I/O pins to the core of the design.

Figure 9:
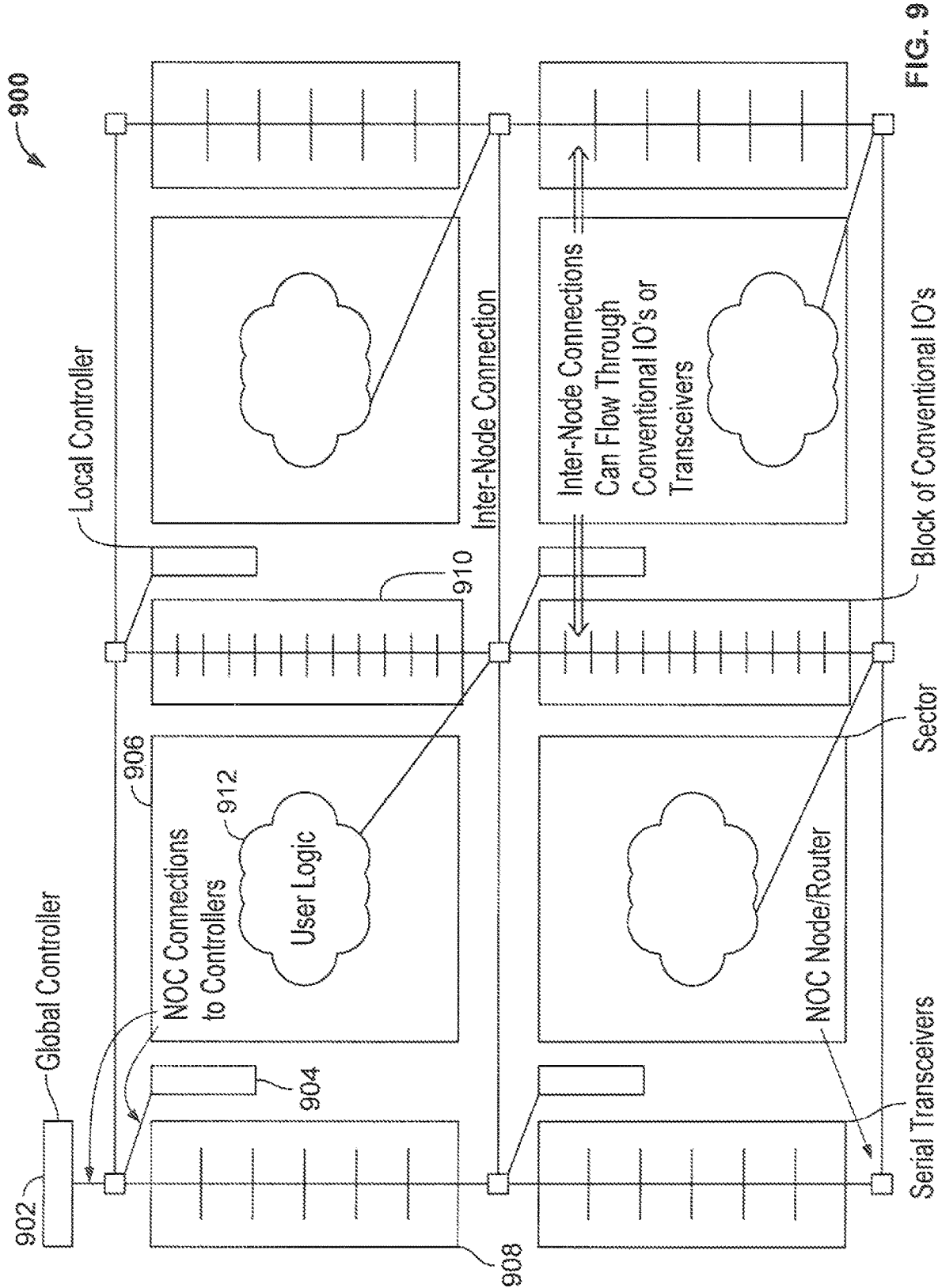
FIG. 9 depicts an illustrative diagram of a sectorized programmable circuit having a mesh-based network-on-chip (NoC) according to certain embodiments.

FIG. 9 depicts an illustrative embodiment of programmable circuit 900 having a mesh-based network-on-chip (NoC) between sectors 906 and I/O-oriented blocks 908 and 910. Each local controller 904 communicates with global controller 902. Global controller 902 coordinates their operations and conveys commands initiated from outside the device. In this arrangement, the inter-sector, controller-to-controller communication network 912 is available in general to the user design after it has been configured into the part. Further information on Networks-on-Chip and FPGAs can be found in commonly-owned U.S. Patent Application Publication No. 2014/0126572, "Programmable Logic Device with Integrated Network-on-Chip," which is hereby incorporated by reference in its entirety. The NoC may carry moderate-bandwidth command and status traffic. Since the inter-sector communication network may still be used for its original, non-user functions while the user design is running, the fraction of its bandwidth allocated to user data transfer may be limited. It may also be possible, however, to over-provision this NoC such that a much higher amount of user data may be sent through it.

Figure 10:
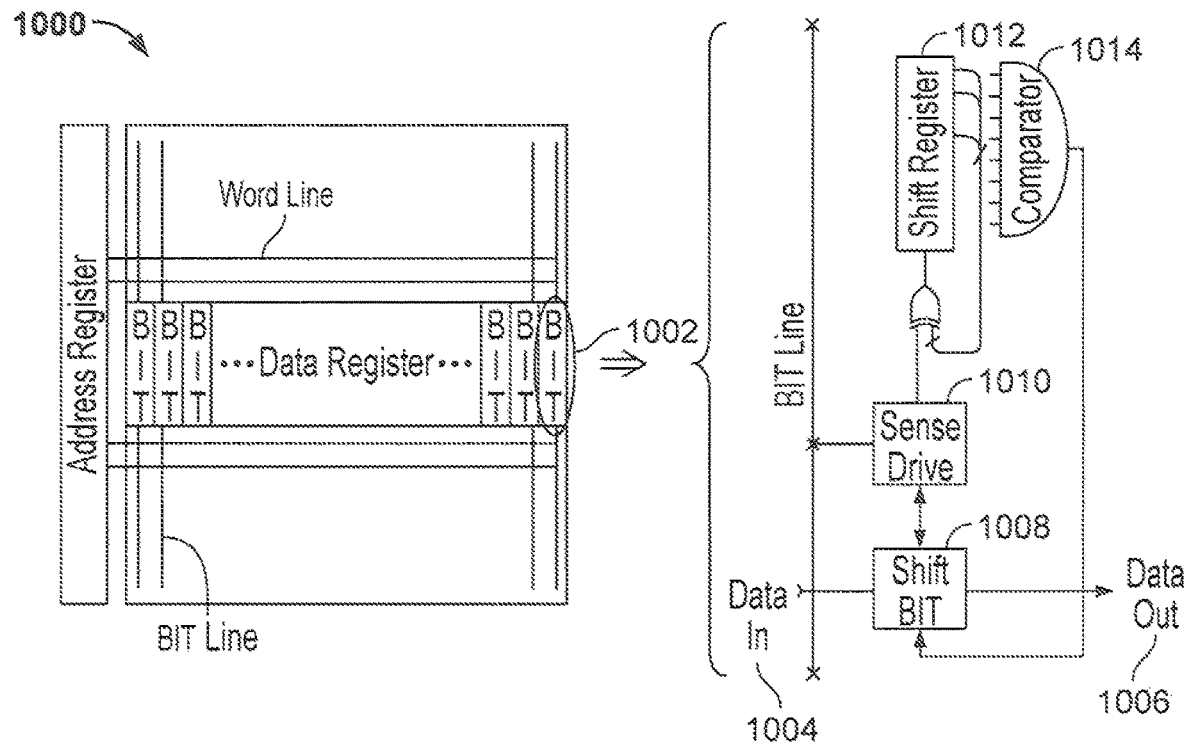
FIG. 10 depicts an illustrative diagram of a sector having circuitry for detecting and correcting SEUs according to certain embodiments.

FIG. 10 depicts an illustrative embodiment of sector 1000 having circuitry 1002 for detecting and correcting single-event upsets (SEUs). In a conventional FPGA, the CRAM array may be continuously read back and a CRC applied to the datastream in order to detect if the bits have changed due to an SEU (as illustrated with respect to FIG. 5). An improvement on this approach may be to include a CRC calculator in the middle of each column as shown in FIG. 10 for detecting SEUs in input data 1004 and outputting corrected data 1006. This CRC calculator may be implemented using a shift bit block 1008, sense-drive block 1010, shift register 1012, and comparator 1014. This may allow CRCs for each column to be computed in parallel, vastly speeding up the detect process. In devices which support partial reconfiguration, the local controller may also solve for the flipped bit and apply a scrubbed bitstream back to the sector via partial reconfiguration, thereby supporting parallel scrubbing across the sectors. In a sectorized FPGA, this arrangement may be applied within each sector. The CRC calculator may appear in each sector-sized fragment of the previously-chip-tall column, further increasing the parallelism. As a further advantage to parallel CRC computation, the localization of the CRC computation reduces the total distance travelled by the configuration to the data register (hence, the capacitance and power consumption), allows for direct computation of the location of the error (localized to the sector), and allows for scrubbing to occur at the local level, further reducing data transport and power consumption.

There may be additional benefits to sectorized SEU mitigation. In many systems, certain portions of the design are more critical than others. Though an SEU is equally likely in equally sized areas, it has greater system impact when it occurs in these portions. For example, in a wireline bridge an error in the control-plane logic may cause erroneous classification and processing of all packets or latching of incorrect router configuration, while an error in the data payload may result in a transient error to a packet that is caught by a higher-level protocol such as a later CRC check. In certain embodiments, sectors include configuration storage (either CRAM or transient registers) which contains a priority setting, e.g., k storage elements indicate $2^k$ levels of priority of an error within the current sector. The output of the error-detect-CRC circuit for the sector may act as an interrupt to the global controller, which may signal to the external monitor. In one example, an empty sector which observes a soft-error in its CRC is assigned a priority of zero. This results in the error being permanently masked through the scrubbing process and does not cause a system reset. In certain embodiments, the CRC output wire is changed to a set of k+m output wires such that the priority and location of the error is indicated back to the global controller, where $2^k$ priorities and $2^m$ sector IDs are indicated.

Because some types of configuration errors may indicate un-recoverable error states or dangerous or safety-critical error states, it may be desirable to create a direct connection between detected errors of a specific priority and signals that can be processed either by the global controller or other logic on the device. In certain embodiments, the priority level of the most recent SEU event is exported from the global controller to user logic, an on-chip embedded processor, or as an exposed pin to user hardware implemented in the FPGA for processing. This may allow a fast reset or halt of FPGA operation without the requirement for error classification by an external processor monitoring the FPGA.

In certain embodiments, the independence of operation across sectors may provide multiple benefits. First, it may be desired to decrease the parallelism and thus the power devoted to SEU mitigation. This may be achieved by decreasing the number of sectors performing CRC checks at any one time and have the subset of sectors actively performing checks rotate through the full set of all sectors over time. Due to the parallelism provided by the multiple sector CRC engines, it may be possible for a small sector to execute CRC computations at a very fast rate, e.g., at 1000 times the rate at which a current FPGA could do so. However, it may not be desirable for power consumption reasons to perform this computation in all sectors, as this would multiply the base power by a proportional amount. In certain embodiments, urgency priorities may be used to schedule the execution of CRC engines to be more or less often. Sectors may include a CRAM or other mode storage designated to indicate the speed at which the local controller should perform CRC calculations, and only the sectors designated as critical are checked at the fast clock-speed while low-priority sectors are checked less often. The priority bits that indicate the frequency of CRC checks may or may not be the same bits as are used for the reporting priority of errors described above.

Next, it may be desired to disable SEU mitigation in a specific subset of sectors while some other operation is performed, e.g., partial reconfiguration. This may allow SEU mitigation to proceed in that part of the device not undergoing reconfiguration, which is not possible in a conventional, non-sectorized FPGA. Furthermore, the characteristics of the user design may dictate that certain sectors' contents are more impacted by SEUs and need to be more frequently checked than others. In a sectorized approach, the local controllers may be designed and/or configured (or put in a mode) such that they check some sectors more frequently than others. As a result, the power devoted to SEU mitigation would be used where it most matters.

It should be noted that though CRC calculation has been used in examples in the foregoing, the same arrangements and design structures apply regardless of whether which one of the following is used: a CRC with a "good-bad" output, a code with a syndrome output uniquely identifying a single-bit error, or an ECC code from which the correct data to be written back can be deduced.

In certain embodiments, assembling a programmable circuit or an FPGA from sectors provides more regularity in the logic surface. It may be possible in the accompanying design software, e.g., to maintain much smaller databases describing each sector instead of a larger single database describing the entire chip surface. With the addition of physical priorities, new capabilities may be indicated for software physical design and placement. Several software mechanisms exist in the prior art for tagging critical entities or signals in an HDL design to be implemented on an FPGA. In certain embodiments, hierarchy tagging defines priority with EDA software (e.g., the QUARTUS® software currently sold by Altera Corporation of San Jose, Calif. or other synthesis, placement, routing to bitstream conversion software) and then the locality of high-priority entities is locally placed according to choices in the configuration of the software, and sectors are assigned the correct priority into storage cells (CRAM or register). In certain embodiments, high-priority sectors are designated during placement and then high-priority logic is restricted to those sectors of the device to enable fast reporting and error recovery while kept away from low-priority logic to enable the above enhancements to SEU detection. Similarly, tools may be provided with the option to preferentially generate empty sectors when the device is not full, thus allowing for a larger number of sectors to be set at low priority for CRC and improving EDCRC performance.

In certain embodiments, the configuration network may transmit instructions to the local controller in a sector to temporarily disable its CRC check or perform other functions. Such instructions may include, but are not limited to, "Halt CRC," "Re-start CRC," "Change sector priority," "Change sector CRC frequency," "Reset the sector configuration to benign (i.e. all-zero) state," "Update other state data stored in the configuration-node," "Prepare to accept partial-reconfiguration stream of length n (followed by stream)," "Set sector to alternate power (vdd or back-bias) state," "Modify a specified configuration bit or set of bits by AND/OR'ing them into the existing bitstream frame," and other suitable power commands arising under the present disclosure. Configuration commands may take an exemplary format of <Sector_ID>,<OPCODE>,<OPERAND>. In certain embodiments, these instructions may be complex and may pass a configuration address and new value, allowing the local controller to make a specific change to the configuration of the sector, instead of processing an entire frame of configuration data. This may allow bitstream updates of certain types to be dramatically smaller.

This mechanism may be used for multiple applications. For example, a design may be set to provide two small memories with different ROM contents for driving the input of a DSP block (as a coefficient memory). Rather than multiplexing between the two ROM contents, the local controller may make a small configuration change to flip the inputs to the routing driving the DSP block to change to the alternate memory. This allows a rare event such as a coefficient ROM update to not result in a propagation delay through a LUT resource in the device and over time allows a ROM to be re-written with new contents without the requirement to reserve permanent FPGA routing resources. In another example, ROM contents that dynamically configure the operation of a device in rarely changing state may be "poked" to new values by the local controller via such instructions. This reduces the unnecessary use of fabric interconnect to route constants that indicate state.

In certain embodiments, global and local controllers may take an active role in the functionality of the design, such as propagating state from an applications processor to sets of local controllers. In certain embodiments, these commands may take the form of broadcast commands. For example, the global controller may execute a set of instructions of the form, "All sectors of type P, prepare for a new bitstream as a partial reconfiguration and freeze," "Broadcast a new bitstream to each sectors," "Un-freeze logic," and other suitable instructions. According to this mechanism, a compressed version of a specific maintenance bitstream, e.g., a simple ring-oscillator for testing performance of the sector, may be applied to each sector of a given type in parallel using only a single sector instance while not requiring external storage of the entire chip bitstream.

In certain embodiments, the local controller in a sector may accept routed inputs from user logic which is then transferred over the configuration network to either the global controller or an embedded processor. This may allow for low-incidence error states to be propagated from individual locations in the design, thereby reducing the burden of the standard fabric for signals which are extremely rare. To facilitate the preceding mechanism, a MegaFunction may be provided. A MegaFunction is a design component, usually delivered in a library of other design components, provided by an FPGA manufacturer to be used by their customers when designing with FPGAs. MegaFunctions become part of the input to the mapping software used to convert a customer's design to a specific set of resources and interconnections inside the FPGA. The MegaFunction may become one large resource, many small resources, or any combination thereof, in the target FPGA. In some embodiments, a MegaFunction is highly parameterized, and accompanying software may be supplied to specify the parameters from a smaller set more easily understood by a designer. This may allow a configuration input port to be instantiated into a user design. A design tool such as the QUARTUS® software (currently sold by Altera Corporation of San Jose, Calif.) may create the placeable object for the configuration input port, place it on a sector's local controller as part of place and route, and provide a mechanism to register the sector ID of the block chosen by the software for the applications embedded processor. This may result in a global interrupt executed out of band over the configuration network.

Programmable circuits or FPGAs may include several kinds of debug-related features. In certain embodiments, sectorizing a programmable circuit may support and strengthen some of these features in a number of ways, principally through the independence of the sectors and the inclusion of an inter-sector communications network. The independence of the sectors may result in shorter scan chains and shallower multiplexer networks since they will be contained entirely within one smaller sector. The inter-sector communication network may be valuable for providing debug functions. The user design need not be later modified, recompiled, and reconfigured in order to include debug connections since the communication network can be used to provide them at least at an inter-sector level. Even if one sector may have its logic altered in order to include extra local debug connections, this would be a local change that can be brought about using partial reconfiguration. Additionally, each sector's local controller may have new debug mode behaviors dynamically loaded into it. For example, it may be desired to monitor a set of wires in one mode, a different set of wires in another mode, and so on, for several modes. The local controller's control program may be dynamically extended to perform this function, which would allow the set of wires monitored at some point in time to be much larger than the number of bits actually sent out from the sector for external monitoring and interpretation.

With regard to power control, sectors may form natural boundaries for power islands. The purpose of a power island is to allow the voltage, and hence the power consumed, to be lowered in those subparts of the design that do not need the extra performance that a higher voltage would offer. In some cases, it may be possible and desirable to fully "cut-off" the power in an entire island. A power island may simply have its own voltage supply or it may use a common voltage supply that first flows through a power switch or regulator. In either case, if the voltage differences between islands can be large enough, then level translators need to be inserted into all signal paths that cross power islands.

Figure 11:
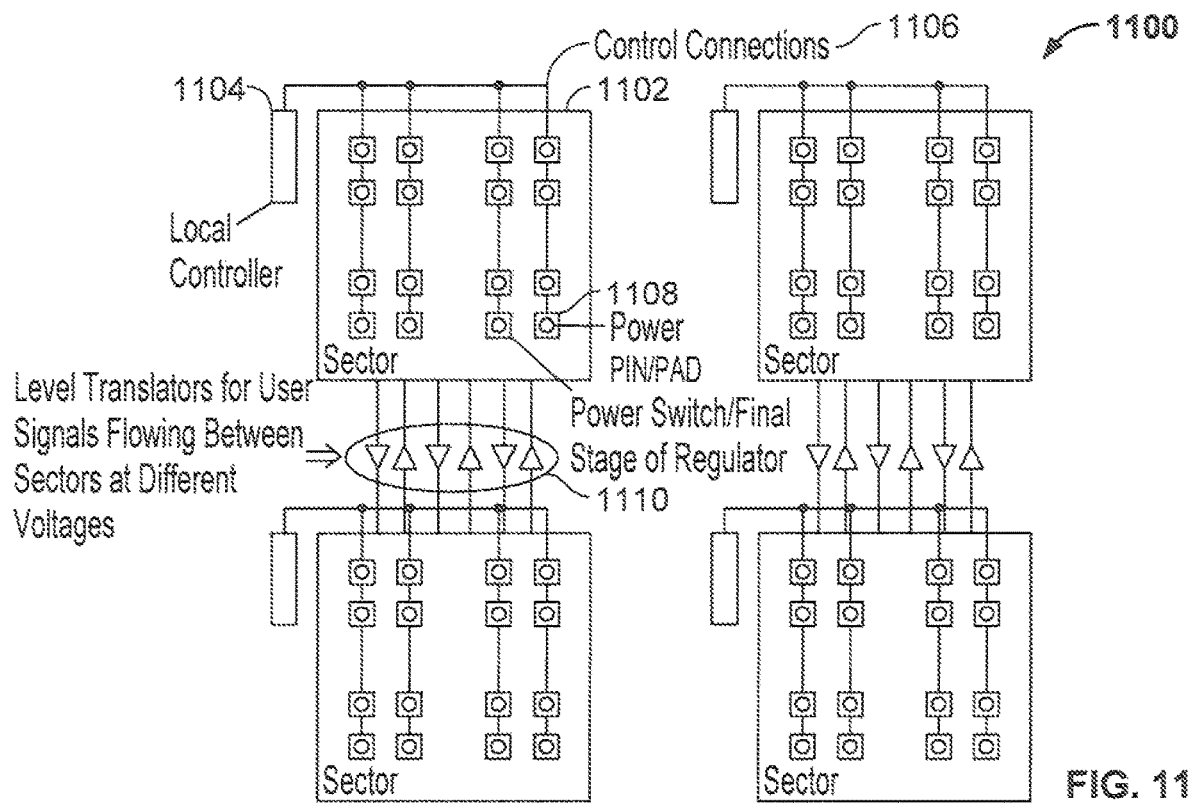
FIG. 11 depicts an illustrative diagram of a sectorized programmable circuit having power controls according to certain embodiments.

The use of sector boundaries as boundaries of power islands may be managed automatically by design software, such as the QUARTUS® software (currently sold by Altera Corporation of San Jose, Calif.), but it may also be possible to manage these relationships manually using a floor-planning step in the software. In particular, it may be desirable to force certain design sections to either be inside, or outside, of certain regions of sectors under a particular power control regime. As illustrated by programmable circuit 1100 depicted in FIG. 11, each sector 1102 forms a connected region supplied by its own power pins 1108. Each sector 1102 includes local controller 1104 which may include a power switch and/or regulator or control circuitry to determine the voltage supplied to the sector's user logic via control connections 1106. In addition to new power features, existing power features may be directly understood by the local controller. For example, CRAM settings in STRATIX® V family of devices (currently sold by Altera Corp. of San Jose, Calif.) and other programmable devices may set level translators 1110 for user signals flowing between sectors at different voltages. The CRAM settings may set individual logic array blocks (LABs) into different back-bias states, enabling high-speed or low-power operation. These state values may be moved to local controller 1104 and modified dynamically.

In certain embodiments, programmable circuits such as FPGAs need to distribute clocks sourced from I/O pins and/or PLLs throughout the core logic. The inclusion of sectors in the clock distribution architecture allows it to be broken into two components: inter-sector clock distribution and then intra-sector clock distribution. The former is addressed in commonly-owned U.S. patent application Ser. No. 14/137,086, "Clock Grid for Integrated Circuit," which is hereby incorporated by reference in its entirety. The latter is a conventional, albeit much smaller, clock distribution problem.

The independence of the sectors and local controllers may allow each sector to use a different clock during configuration or other operations. In a sectorized FPGA, different clock sources, such as a ring oscillator inside the FPGA or clocks supplied from outside, may be used during conventional full-chip configuration. However, sector-specific clocks may be extremely useful during partial reconfiguration, especially if that partial reconfiguration is happening under the control of another (unchanging) part of the FPGA design and/or there are multiple regions that may undergo partial reconfiguration simultaneously. The independent clocks may allow the different operations to be completely independent and even operate at different frequencies if desired.

Figure 12:
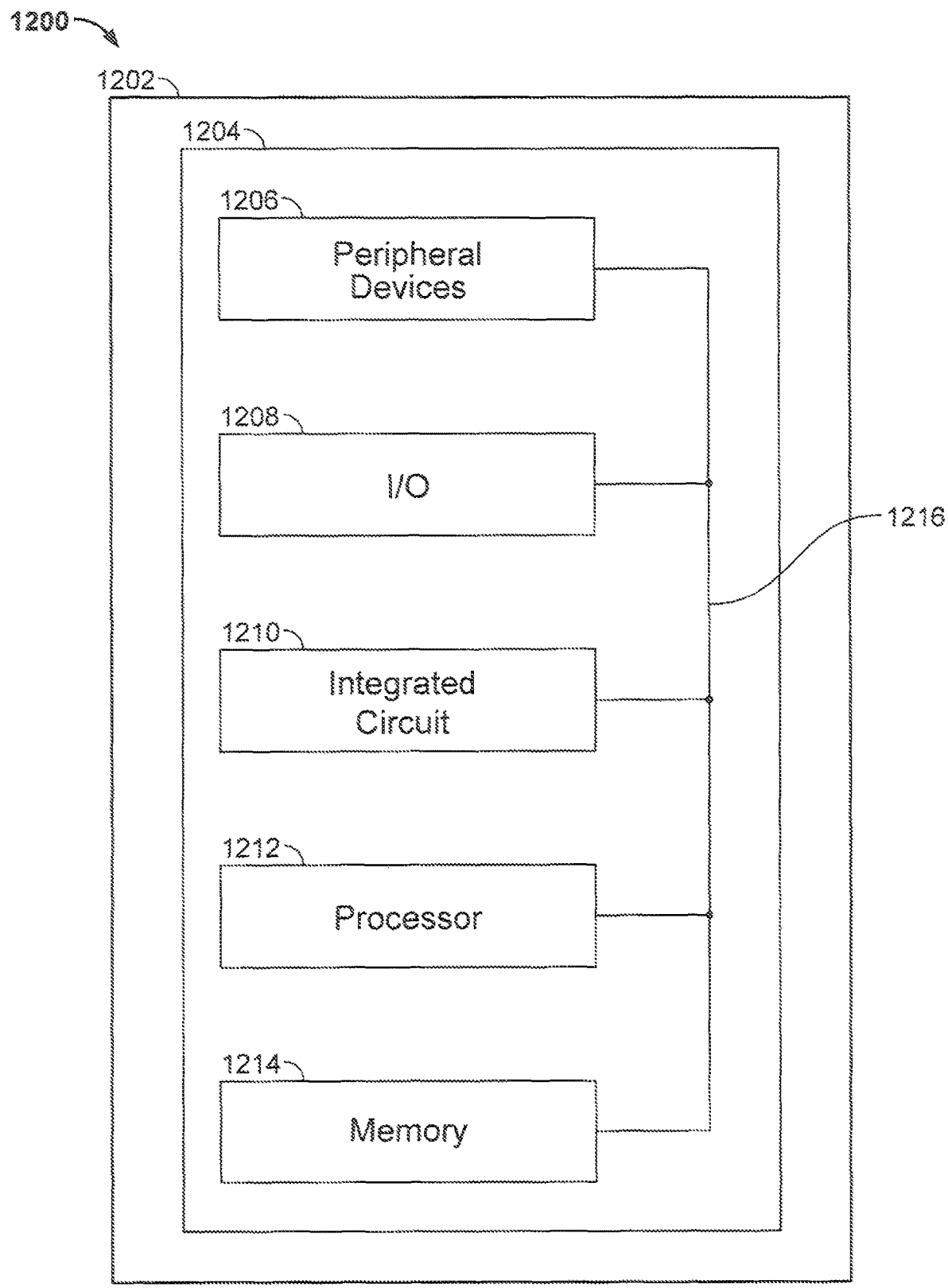
FIG. 12 depicts a simplified block diagram of an illustrative system employing an integrated circuit device incorporating aspects of the present disclosure according to certain embodiments.

FIG. 12 illustrates a circuit or other device 1210 that includes embodiments of a basic block module (e.g., of MACs), implemented using a data flow graph, which makes use of a programmable circuit having sectors as being within a data processing system 1200. In certain embodiments, integrated circuit or device 1210 may be an integrated circuit, application specific standard product (ASSP), application specific integrated circuit (ASIC), programmable logic device (PLD), including a Field-Programmable Gate Array (FPGA), full-custom chip, or dedicated chip). In certain embodiments, element 1210 may include programmable circuit 500, 600, 700, 800, 900, and/or 1100. Data processing system 1200 may include one or more of the following components: circuit 1210, processor 1212, memory 1214, I/O circuitry 1208, and peripheral devices 1206. These components are connected together by a system bus or other interconnections 1216 and are populated on circuit board 1204 which is contained in end-user system 1202.

System 1200 may be used in a wide variety of applications, such as computer networking, data networking, instrumentation, video processing, digital signal processing, or any other application where the advantage of using programmable or reprogrammable logic is desirable. Circuit 1210 may be used to perform a variety of different logic functions. For example, circuit 1210 may be configured as a processor or controller that works in cooperation with processor 1212. Circuit 1210 may also be used as an arbiter for arbitrating access to a shared resource in system 1200. In yet another example, circuit 1210 can be configured as an interface between processor 1212 and one of the other components in system 1200. It should be noted that system 1200 is only exemplary, and that the true scope and spirit of the invention should be indicated by the following claims.

Although components in the above disclosure are described as being connected with one another, they may instead be connected to one another, possibly via other components in between them. It will be understood that the foregoing are only illustrative of the principles of the invention, and that various modifications can be made by those skilled in the art without departing from the scope and spirit of the invention. One skilled in the art will appreciate that the present invention can be practiced by other than the described embodiments, which are presented for purposes of illustration and not of limitation, and the present invention is limited only by the claims that follow.

The embodiments shown in this disclosure may save power and area, and in so doing, may also increase performance. Although these quantities may be easy to measure, the individual contributions of particular circuitry within the embodiments shown in this disclosure may be difficult to separate from contributions of other circuitry on any device or chip on which the circuitry are implemented.

Interactive interface applications and/or any instructions for layout of or use of the circuit designs of any of the embodiments described herein may be encoded on computer readable media. Computer readable media includes any media capable of storing data. The computer readable media may be transitory, including, but not limited to, propagating electrical or electromagnetic signals, or may be non-transitory including, but not limited to, volatile and non-volatile computer memory or storage devices such as a hard disk, floppy disk, USB drive, DVD, CD, media cards, register memory, processor caches, Random Access Memory ("RAM"), etc.

Figure 13:
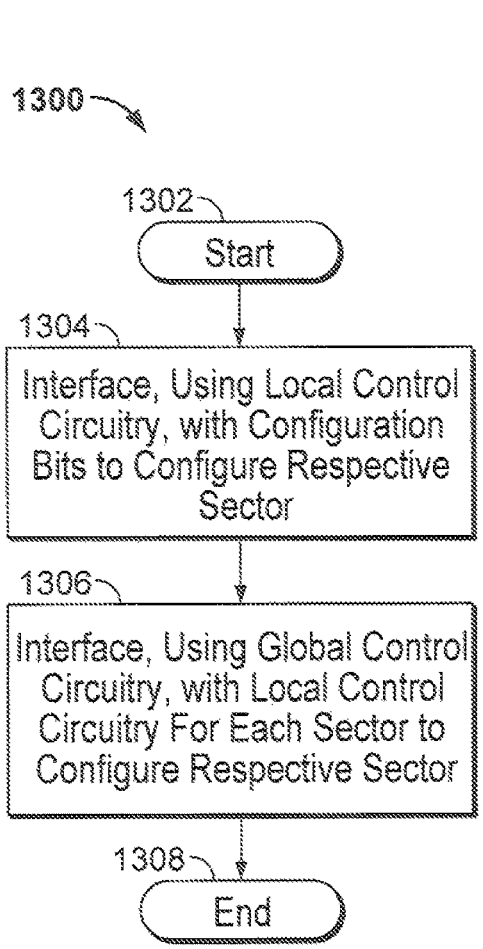
FIG. 13 depicts an illustrative process by which a sectorized programmable circuit is configured for operation according to certain embodiments.

FIG. 13 depicts illustrative process 1300 by which a sectorized programmable circuit is configured for operation. Process 1300 may be implemented by a programmable logic device, such as data processing system 1200 of FIG. 12. The process begins at step 1302. At step 1304, local control circuitry for each sector interfaces with its configurations bits to configure the sector. At step 1306, the global control circuitry interfaces with respective local control circuitry to configure the sector. Once the sector is configured, the process ends at step 1308.

Figure 14:
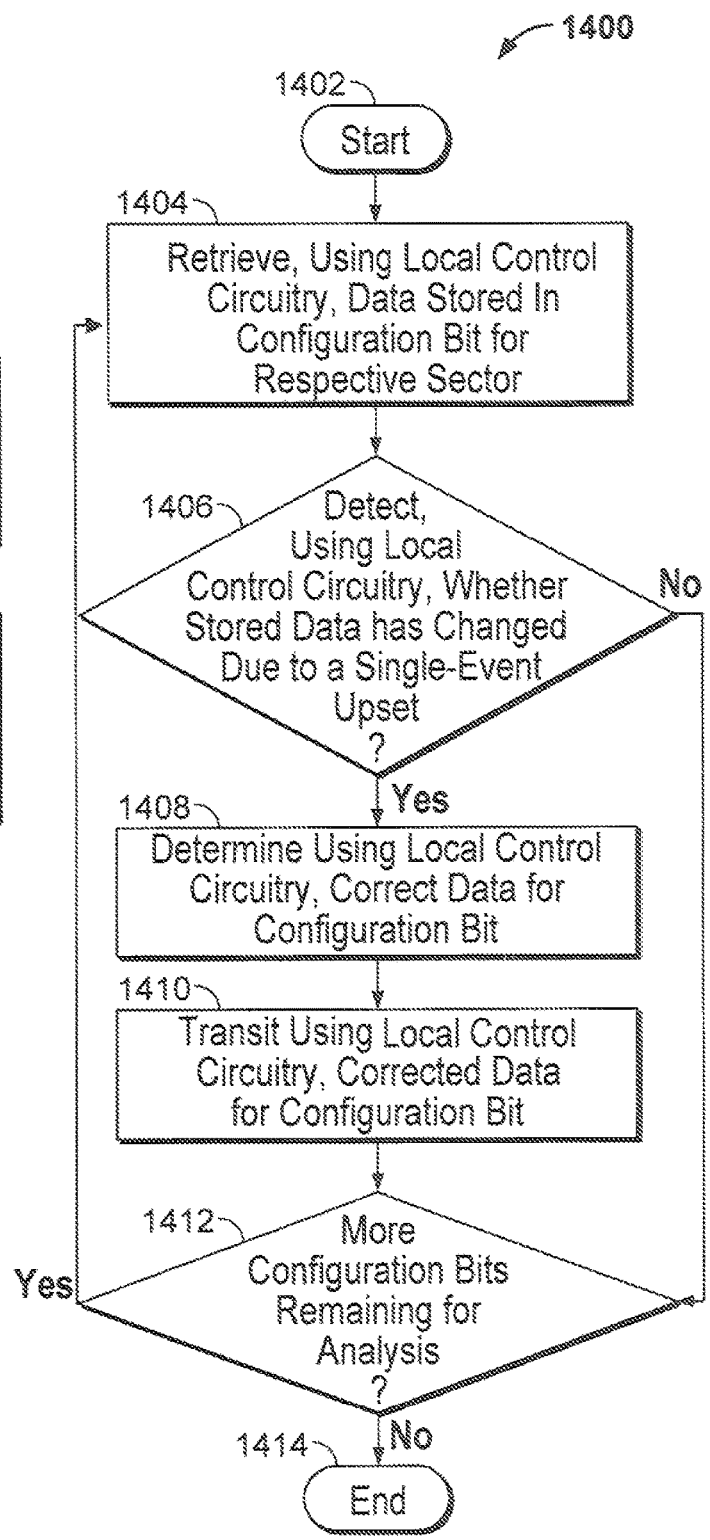
FIG. 14 depicts an illustrative process by which a local controller in a sectorized programmable circuit detects and corrects SEUs according to certain embodiments.

FIG. 14 depicts illustrative process 1400 by which a local controller in a sectorized programmable circuit detects and corrects SEUs. Process 1400 may be implemented by a programmable logic device, such as data processing system 1200 of FIG. 12. The process begins at step 1402. At step 1404, local control circuitry retrieves data stored in a configuration bit. At step 1406, the local control circuitry detects whether the data for the configuration bit has changed due to a single-event upset. If not, local control circuitry proceeds to step 1412. If so, at step 1408, local control circuitry determines the corrected data for the configuration bit. This is further described with respect to FIG. 4 and FIG. 10. At step 1410, local control circuitry transmits the corrected data for the configuration bit. At step 1412, local control circuitry determines if more configuration bits remain to be analyzed. If so, local control circuitry proceeds to step 1404. Once the configuration bits have been analyzed, the process ends at step 1414.

It is contemplated that the steps or descriptions of FIG. 13 and FIG. 14 may be used with any other embodiment of this disclosure. In addition, the steps and descriptions described in relation to FIG. 13 and FIG. 14 may be done in alternative orders or in parallel to further the purposes of this disclosure. For example, each of these steps may be performed in any order or in parallel or substantially simultaneously to reduce lag or increase the speed of the system or method. Furthermore, it should be noted that any suitable device, such as those associated with data processing system 1200 as discussed in relation to FIG. 12, could be used to perform one or more of the steps in FIG. 13 and FIG. 14.

It will be understood that the foregoing uses of the terms "programmable circuit" and "FPGA" are exemplary, and such use may be applicable to programmable logic devices and other suitable circuits, including but not limited to commercial FPGAs, configurable ASSP devices, configurable DSP and GPU devices, hybrid ASIC/programmable devices, devices which are described as ASICs with programmable logic cores, or programmable logic devices with embedded ASIC or ASSP cores.

It will be understood that the foregoing is only illustrative of the principles of the invention, and that various modifications may be made by those skilled in the art without departing from the scope and spirit of the invention, and the present invention is limited only by the claims that follow. For example, the various inventive aspects that have been discussed herein can either all be used together in certain embodiments, or other embodiments may employ only one or more (but less than all) of the inventive aspects. And if multiple (but less than all) of the inventive aspects are employed, that can involve employment of any combination of the inventive aspects. As another example of possible modifications, throughout this disclosure, particular parameter values are mentioned. These particular values are only examples, and other suitable parameter values can be used instead if desired.

What is claimed is:

1. A programmable circuit comprising:
   a plurality of sectors, wherein each sector comprises:
      at least one configurable functional block;
      a plurality of configurable routing wires;
      a memory having at least one configuration bit that stores configurations for the at least one configurable functional block and the plurality of configurable routing wires; and
      local control circuitry comprising a state machine, wherein the state machine configures the sector by programming the at least one configuration bit into the memory and generates signals that drive clock lines of the sector; and
   global control circuitry that sends at least one respective configuration bit to respective local control circuitry for each sector of the plurality of sectors;
   wherein a first signal generated by a first state machine of a first local control circuitry of a first sector of the plurality of sectors is configured to drive at least a first clock line of the first sector at a first frequency;
   wherein a second signal generated by a second state machine of a second local control circuitry of a second sector of the plurality of sectors is configured to drive at least a second clock line of the second sector at a second frequency; and
   wherein the first frequency is different from the second frequency.

2. The programmable circuit of claim 1, wherein the global control circuitry transmits one or more global signals to respective local control circuitry for each sector of the plurality of sectors, wherein the one or more global signals relate to at least one of a configuration mode, a test mode, and a clocking mode for each sector.

3. The programmable circuit of claim 1, wherein each sector further comprises:
   a power supply; and
   power control circuitry in communication with the local control circuitry.

4. The programmable circuit of claim 1, wherein the state machine of the local control circuitry for each sector:
   retrieves data stored in the at least one configuration bit;
   detects whether the stored data has changed due to a single-event upset; and
   in response to detecting that the stored data has changed, transmits corrected data for the at least one configuration bit.

5. The programmable circuit of claim 1, wherein at least one of the state machine of the local control circuitry and the global control circuitry configures a first sector of the plurality of sectors, wherein the first sector comprises a different number of configurable functional blocks, configurable routing wires, or both, than a second sector of the plurality of sectors.

6. The programmable circuit of claim 1, wherein at least one of the state machine of the local control circuitry and the global control circuitry:
   configures a first portion of the sector; and
   configures the first portion as a redundancy region for a second portion of the sector;
   wherein the first portion comprises a different number of configurable functional blocks, configurable routing wires, or both, than the second portion.

7. The programmable circuit of claim 1, wherein the local control circuitry for each sector includes a stored-program processor.

8. A method for operating a programmable circuit comprising global control circuitry and a plurality of sectors, each sector comprising at least one configurable functional block, a plurality of configurable routing wires, a memory configured to store a respective bitstream that configures the at least one configurable functional block and the plurality of configurable routing wires to execute a respective program, a plurality of bit lines and a plurality of word lines configured to modify and read back the at least one configuration bit, a plurality of shift registers configured to access the plurality of bit lines and the plurality of word lines, and local control circuitry comprising a state machine, the method comprising:
   programming, using the state machine, the respective bitstream into the memory to configure the sector via the plurality of bit lines and the plurality of word lines by controlling the plurality of shift registers to execute the respective program, wherein the state machine is configured to generate signals internally that drive the plurality of word lines, the plurality of bit lines, and multiplexers of the sector; and
   sending, using the global control circuitry, at least one respective configuration bit of the respective bitstream to respective local control circuitry for each sector of the plurality of sectors.

9. The method of claim 8, further comprising:
   transmitting, using the global control circuitry, one or more global signals to respective local control circuitry for each sector of the plurality of sectors, wherein the one or more global signals relate to at least one of a configuration mode, a test mode, and a clocking mode for each sector.

10. The method of claim 8, wherein each sector further comprises a power supply and power control circuitry in communication with the local control circuitry.

11. The method of claim 8, further comprising:
    retrieving, using the local control circuitry, data stored in the memory;
    detecting, using the local control circuitry, whether the data has changed due to a single-event upset; and
    in response to detecting that the data has changed, transmitting, using the local control circuitry, corrected data for the data that has changed.

12. The method of claim 8, further comprising configuring, using at least one of the local control circuitry and the global control circuitry, a first sector of the plurality of sectors, wherein the at least one configurable functional block, the memory, or both, of the first sector, are of a different size than the at least one configurable functional block, the memory, or both, of a second sector of the plurality of sectors.

13. The method of claim 8, further comprising:
    configuring, using at least one of the local control circuitry and the global control circuitry, a first portion of the sector; and
    designating the first portion as a redundancy region for a second portion of the sector;
    wherein the at least one configurable functional block, the memory, or both, of the first portion, are of a different size than the at least one configurable functional block, the memory, or both, of the second portion.

14. The method of claim 8, wherein the local control circuitry for each sector includes at least one of a state machine and a stored-program processor.

15. A programmable circuit comprising:
a plurality of sectors, wherein each sector comprises:
   at least one configurable functional block;
   a plurality of configurable routing wires;
   a memory configured to store a respective bitstream that configures the at least one configurable functional block and the plurality of configurable routing wires to execute a respective program; and
   local control circuitry comprising a state machine, wherein the state machine configures the sector by:
      programming the respective bitstream into the memory;
      determining if at least one configuration bit of the respective bitstream programmed in the memory has changed;
      determining corrected data for the at least one configuration bit; and
      programming the corrected data for the at least one configuration bit into the memory;
wherein each sector is independently operable and operable in parallel with other sectors based on configuration by a respective local control circuitry.

16. The programmable circuit of claim 15, wherein each sector further comprises:
   a power supply; and
   power control circuitry in communication with the local control circuitry.

17. The programmable circuit of claim 15, wherein the at least one of the state machine and the stored-program processor:
   configures a first sector of the plurality of sectors;
   wherein the first sector comprises a different number of configurable functional blocks, configurable routing wires, or both, than a second sector of the plurality of sectors.

18. The programmable circuit of claim 15, wherein the at least one of the state machine and the stored-program processor:
   configures a first portion of the sector; and
   designates the first portion as a redundancy region for a second portion of the sector;
   wherein the first portion comprises a different number of configurable functional blocks, configurable routing wires, or both, than the second portion.

* * * * *